United States Patent [19]
Hayafuji et al.

[11] Patent Number: 6,072,373
[45] Date of Patent: Jun. 6, 2000

[54] VOLTAGE CONTROLLED OSCILLATOR WITH IMPEDANCE REGULATION CIRCUIT INCLUDING A SWITCHING ELEMENT

[75] Inventors: Hisao Hayafuji; Hiroyuki Yamamoto, both of Shiga-ken, Japan

[73] Assignee: Murata Manufacturing Co., Ltd., Nagaokakyo, Japan

[21] Appl. No.: 09/203,391

[22] Filed: Dec. 2, 1998

[30] Foreign Application Priority Data

Dec. 3, 1997 [JP] Japan ................................. 9-333169

[51] Int. Cl.⁷ ............................................. H03B 5/00
[52] U.S. Cl. ........................... 331/108 R; 331/117 R; 331/177 V; 331/74; 331/36 C
[58] Field of Search ...................... 331/108 R, 117 R, 331/117 D, 177 R, 181, 177 V, 74, 36 C, 179; 455/180.2, 193.1

*Primary Examiner*—Arnold Kinkead
*Attorney, Agent, or Firm*—Burns, Doane, Swecker & Mathis, LLP

[57] ABSTRACT

A voltage control oscillator capable of obtaining the desired output voltage by lowering the higher order harmonic level, is provided. Further, in the voltage control oscillator, a resonance circuit achieves the resonance by switching two different resonance frequencies. Moreover, inductors of a matching circuit are selectively used to change the inductance by turning on/turning off a diode of an impedance regulation circuit according to the respectively switched frequencies. Furthermore, the synthesized impedance with a matching capacitor is changed to achieve the matching with each of two frequencies.

8 Claims, 4 Drawing Sheets

VOLTAGE CONTROLLED OSCILLATOR WITH IMPEDANCE REGULATION CIRCUIT INCLUDING A SWITCHING ELEMENT

This application is based on Japanese Patent Application No. 9-333169, filed on Dec. 3, 1997, the entire contents of which are incorporated by reference herein.

BACKGROUND OF THE INVENTION

1. Field of the Invention

The present invention relates to a voltage control oscillator mounted on various kinds of high frequency devices, more specifically, the voltage control oscillator to be operated by switching two frequencies different from each other as the oscillation frequency.

2. Description of the Related Art

The construction of a conventional voltage control oscillator is explained referring to FIG. 4.

In FIG. 4, 1 denotes a voltage control oscillator, which comprises a resonance circuit 2, an oscillation circuit 3, a buffer circuit 4, and a matching circuit 5.

The resonance circuit 2 is a circuit to select either of two frequencies different from each other, and to output the signal resonated by the selected frequency. The specific construction of the resonance circuit 2 is not indicated in a figure. For example, it comprises two resonance devices to be resonated at the resonance frequencies different from each other, and selects and drives either resonance device, and switches two frequency signals to output the switched one. Another resonance circuit is provided with an inductor and a capacitor, regulates the synthesized impedance by regulating the inductance or capacitance generated in these elements, and switches two frequency signals different from each other to output the switched one.

The oscillation circuit 3 comprises a first transistor TR1, and a capacitor C1 to be connected between base-emitter terminals of the first transistor TR1. The emitter terminal of the first transistor TR1 is grounded through a capacitor C2.

The buffer circuit 4 is provided with a second transistor TR2, and a collector terminal of the second transistor TR2 is connected to an output terminal Vout through a capacitor C3. The emitter terminal of the first transistor TR1 is connected to the base terminal of the second transistor TR2 through a coupling capacitor C4. The connection point of the collector terminal of the first transistor TR1 to the emitter terminal of the second transistor TR2 is grounded through a capacitor C5. The capacitor C5 is jointly used by the oscillation circuit 3 and the buffer circuit 4.

The matching circuit 5 is provided with an inductor L1 and a matching capacitor C6, and one end of the inductor L1 is connected to the collector terminal of the second transistor TR2, and the other end of the inductor L1 is connected to a power-supply voltage input terminal Vsc. The connection point of the collector terminal of the second transistor TR2 to the output terminal Vout is grounded through the matching capacitor C6. The connection point of the other end of the inductor L1 to the power-supply voltage input terminal Vsc is grounded through a matching capacitor C7.

In the voltage control oscillator 1, the oscillation frequency to be used can be switched from the frequency fa in the 800 MHz zone to the frequency fb in the 1.6 GHz zone. That is, the output signal of the resonance circuit 2 is received by the base terminal of the first transistor TR1, and amplified by the capacitor C1 and oscillated therefrom. The oscillation signal is received by the base terminal of the second transistor TR2 through the coupling capacitor C4, amplified by the second transistor TR2, and then, received by the matching circuit 5 from the collector terminal of the second transistor TR2, matched by the matching circuit 5, and outputted outside the voltage control oscillator 1 from the output terminal Vout.

However, the conventional voltage control oscillator 1 has the following problems.

When the frequency fa in the 800 MHz zone is switched from the frequency fb in the 1.6 GHz zone as the oscillation frequency of the voltage control oscillator 1, and if fb is close to 2fa which is the higher order harmonic wave of fa, it is difficult to lower the higher order harmonic level of 2fa to obtain the output power of fb, and it is thus difficult to obtain the desired output power.

Thus, the object of the present invention is to provide a voltage control oscillator capable of obtaining the desired output power by lowering the higher order harmonic level.

SUMMARY OF THE INVENTION

To achieve the above-mentioned object, the voltage control oscillator in the present invention comprises a resonance circuit which selects either of two frequencies different from each other and outputs the signal resonated at the selected frequency, an oscillation circuit which is provided with a first transistor, amplifies and oscillates the output signal of the resonance circuit, a buffer circuit which is provided with a second transistor and amplifies the output signal of the oscillation circuit, a matching circuit which is provided with an inductor and a matching capacitor and matches the output signal of the buffer circuit, and an impedance regulation circuit provided with a switching element, wherein the synthesized impedance in the matching circuit is changed so as to be matched with the frequency selected by the resonance circuit by turning on or turning off the switching element to constitute the impedance regulation circuit according to the applied voltage.

Further, the voltage control oscillator is characterized in that the matching circuit comprises a first inductor, a second inductor and the matching capacitor, wherein the first inductor and the second inductor are connected in series to each other, and the connection point of the first inductor to the second inductor is connected to the switching element to constitute the impedance regulation circuit.

Further, it is characterized in that the switching element to constitute the impedance regulation circuit is connected to the matching capacitor to constitute the matching circuit in series or in parallel.

Further, it is characterized in that the switching element to constitute the impedance regulation circuit is connected to the inductor to constitute the matching circuit in parallel.

Further, it is characterized in that the switching element comprises either of a diode, a transistor or a variable capacitance diode.

In the voltage control oscillator in the present invention, the switching element to constitute the impedance regulation circuit is turned on/turned off according to the frequency selected by the resonance circuit. The inductance or the capacitance in the matching circuit is changed, and as a result, the synthesized impedance is changed, and matching to each of two frequencies is achieved. Through the matching with the respective frequency by switching two frequencies, the higher order harmonic level is dropped to obtain the desired output voltage.

DESCRIPTION OF THE PREFERRED EMBODIMENT

Figure 1:
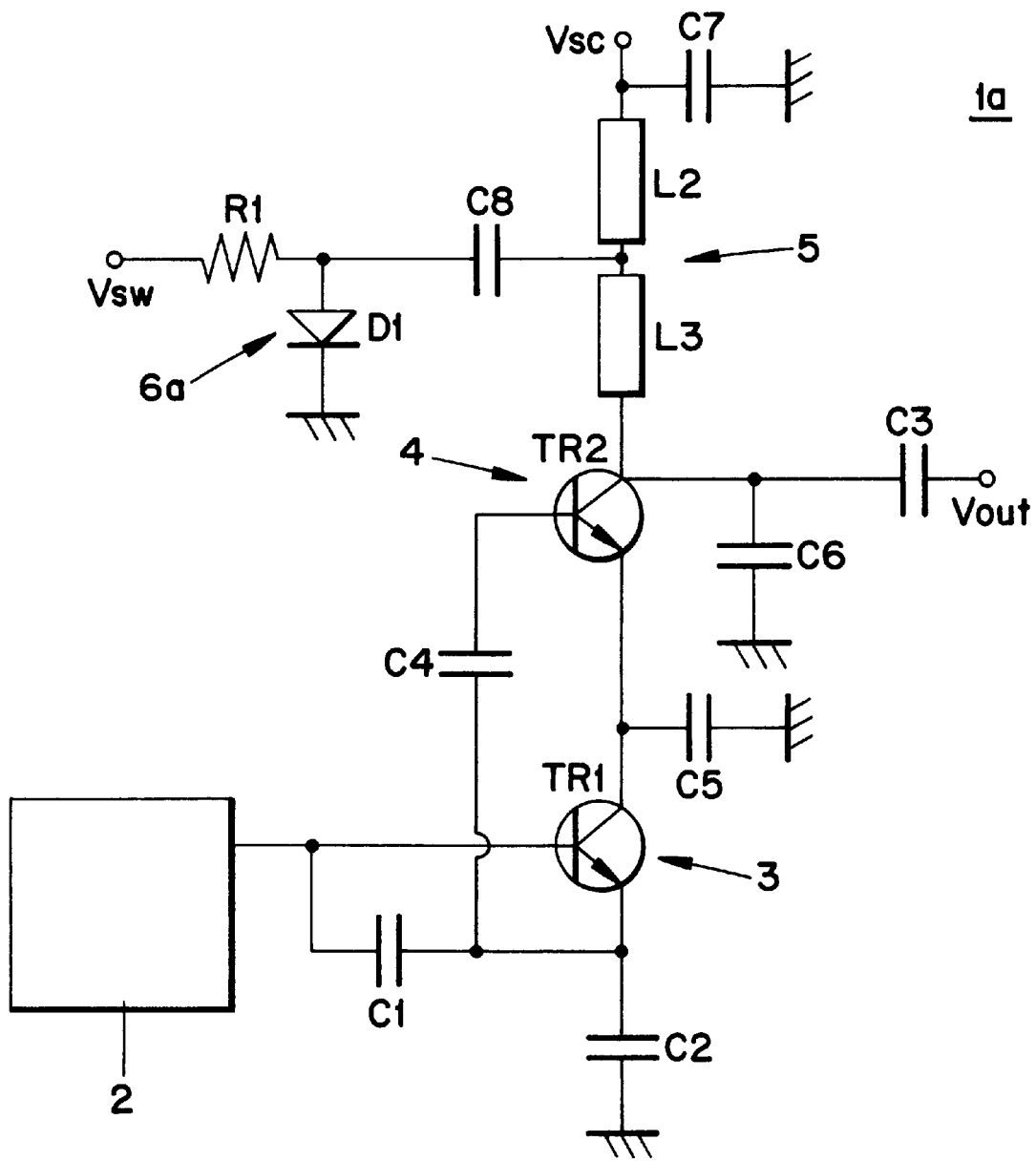
FIG. 1 is a block diagram illustrating the voltage control oscillator of the first exemplary embodiment of the present invention.
Figure 4:
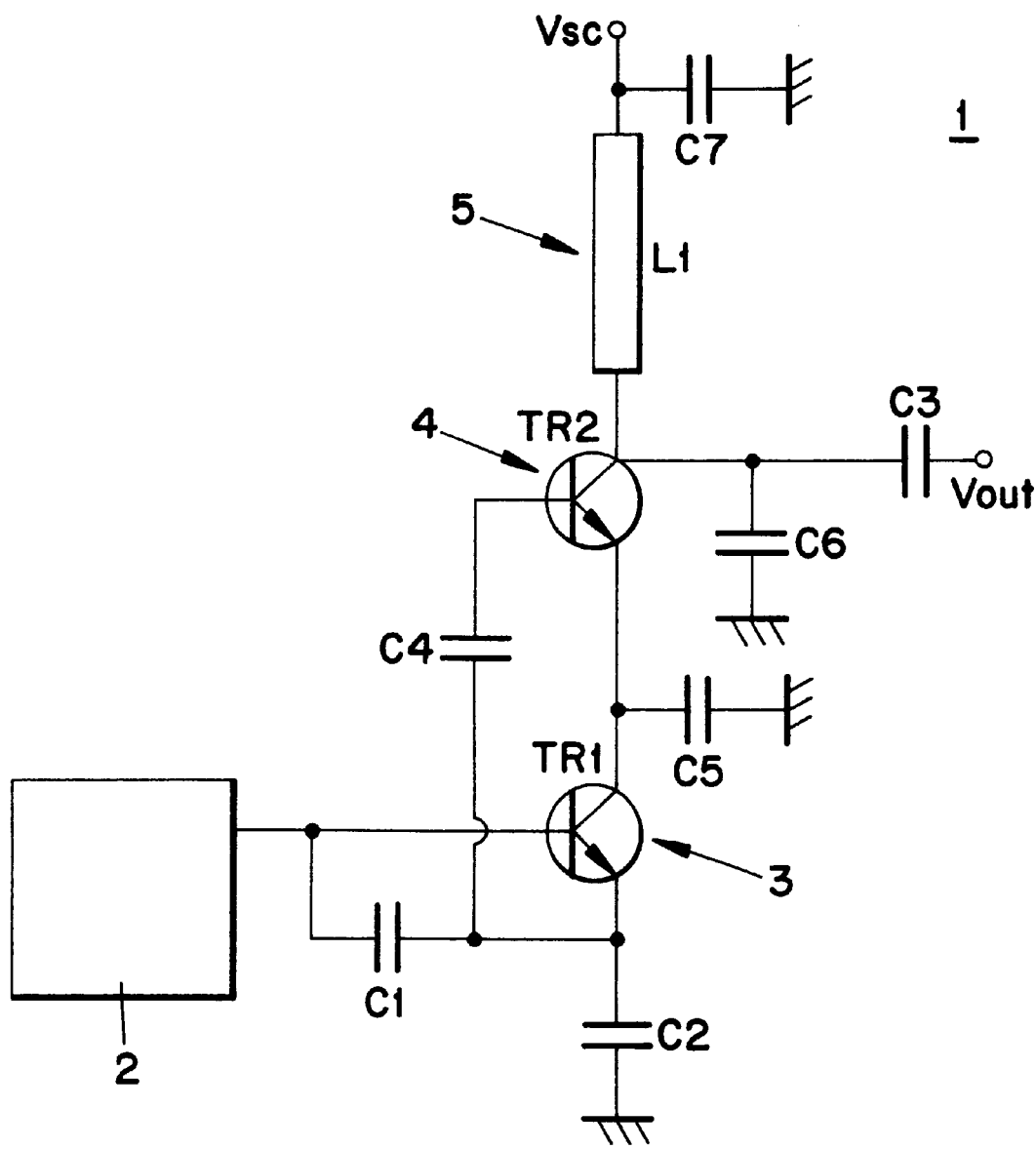
FIG. 4 is a block diagram illustrating the conventional voltage control oscillator.

The construction of the voltage control oscillator of the first embodiment of the present invention is described with reference to FIG. 1. In FIG. 1, the same sign is attached to the part same as or equivalent to that in FIG. 4, and its explanation is omitted.

In FIG. 1, 1a denotes a voltage control oscillator, which comprises a resonance circuit 2, an oscillation circuit 3, a buffer circuit 4, a matching circuit 5, and an impedance regulation circuit 6a. An inductor to constitute the matching circuit 5 comprises two inductors L2,L3 to be connected in series to each other. The impedance regulation circuit 6a comprises a diode D1 as a switching element, a coupling capacitor C8, and a bias resistor R1. One end of the coupling capacitor C8 is connected to a connection point of the inductors L2,L3, and the other end is connected to the bias resistor R1 in series, and further, the bias resistor R1 is connected to a switching voltage input terminal Vsw. Further, an anode terminal of the diode D1 is connected to a connection point of the coupling capacitor C8 to the bias resistor R1, and a cathode terminal of the diode D1 is grounded. The switching voltage input terminal Vsw is connected to a control means of a device on which the voltage control oscillator 1a is mounted, and the voltage to drive the diode D1 is applied from the control means.

The operation of the voltage control oscillator 1a is described illustrating the case where the frequency fa present in the 800 MHz zone and the frequency fb present in the 1.6 GHz zone are the oscillation frequencies.

In a case where the oscillation frequency is fa, the output signal of a first transistor TR1 is amplified and oscillated by a coupling capacitor C4, and received by a second transistor TR2. In this condition, no drive voltage of the diode D1 is inputted from the switching voltage input terminal Vsw. Thus, the diode D1 is in the open condition in the high frequency manner, and the side from the coupling capacitor C8 to the diode D1 is electrically separated from the inductors L2,L3. The matching circuit 5 is set to be matched with the frequency fa by the synthesized impedance by the inductors L2,L3 and a matching capacitor C6, the frequencies other than fa are attenuated, and only the signal of the frequency fa is outputted from an output terminal Vout.

On the other hand, in a case where the oscillation frequency is fb, the drive voltage of the diode D1 is inputted from the switching voltage input terminal Vsw. Because the diode D1 is grounded in the high frequency manner, the inductor L3 is grounded. The matching circuit 5 is set to be matched with the frequency fb by the synthesized impedance by the inductor L3 and the matching capacitor C6, the frequencies other than, fb are attenuated, and only the signal of the frequency fb is outputted from the output terminal Vout.

Thus, in the voltage control oscillator 1a, the inductors L2,L3 are selectively used by turning on/turning off the diode D1 according to the frequency selected by the resonance circuit 2. Because the inductance in the matching circuit 5 is changed and the synthesized impedance with the matching capacitor C6 is changed, matching can be achieved with two frequencies, respectively. Thus, the desired output voltage can be obtained by lowering the higher order harmonic level.

Next, the construction of the voltage control oscillator of the second embodiment of the present invention is described with reference to FIG. 2. In FIG. 2, the same sign is attached to the same or equivalent part to that in FIG. 4, and its explanation is omitted.

Figure 2A:
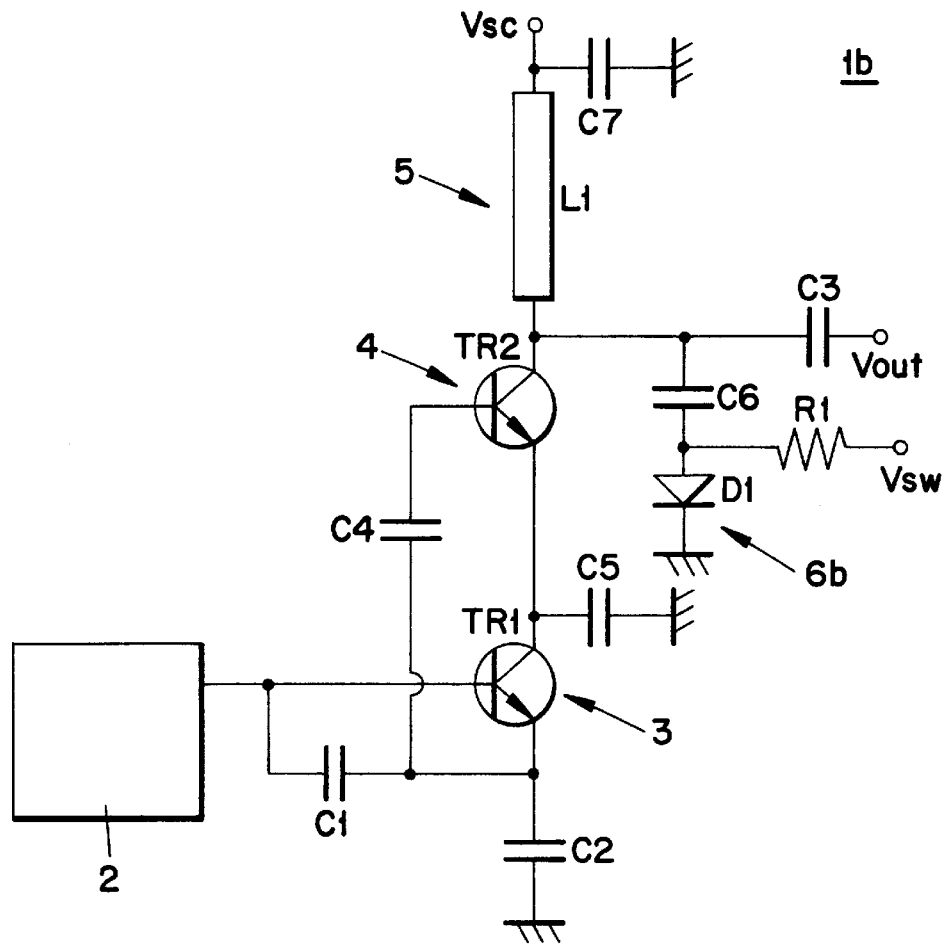
FIG. 2A is a block diagram illustrating the voltage control oscillator of the second exemplary embodiment of the present invention.

In FIG. 2A, 1b denotes a voltage control oscillator, which comprises the resonance circuit 2, the oscillation circuit 3, the buffer circuit 4, the matching circuit 5, and the impedance regulation circuit 6b. The impedance regulation circuit 6b is provided with the diode D1 as the switching element, and the bias resistor R1. The diode D1 is connected in series to the matching capacitor C6 between one end of the matching capacitor C6 to constitute the matching circuit 5 and the ground. The connection point of one end of the matching capacitor C6 to the diode D1 is connected to the switching voltage input terminal Vsw through the bias resistor R1.

The operation of the voltage control oscillator 1b is described below.

In a case where the oscillation frequency of the voltage control oscillator 1b is the frequency fa in the 800 MHz zone, the diode D1 is grounded in the high frequency manner by applying the drive voltage to the diode D1, and the matching circuit 5 is grounded with the capacitance of only the matching capacitor C6. The matching circuit 5 is set to be matched with the frequency fa by the synthesized impedance by the inductor L1 and the matching capacitor C6, and only the signal of the frequency fa is outputted.

On the other hand, in a case where the oscillation frequency is fb in the 1.6 GHz zone, no drive voltage is applied to the diode D1, and the diode D1 has small capacitance in the high frequency manner. Because the diode D1 is connected to the matching capacitor C6 in series, the small capacitance of the diode D1 becomes dominant in the synthesized capacitance of the diode D1 with the matching capacitor C6. The matching circuit 5 is set to be matched with the frequency fb by the synthesized impedance by the inductor L1 and the diode D1, and only the signal of the frequency fb is outputted.

Thus, in the voltage control oscillator 1b, the capacitance in the matching circuit 5 is changed by turning on/turning off the diode D1 according to the frequency selected by the resonance circuit 2, and the synthesized impedance with the inductor L1 is changed. Matching can be achieved with two frequencies, respectively, and the desired output voltage can be obtained by lowering the higher order harmonic level.

Figure 2B:
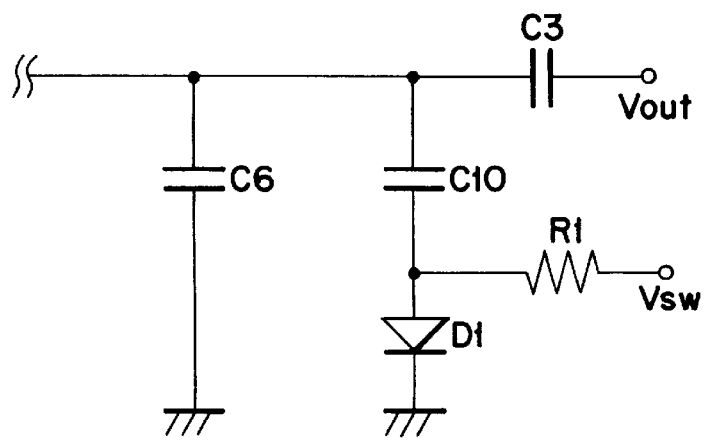
FIG. 2B is a part of the block diagram of FIG. 2A showing the diode is connected in parallel to the matching capacitor.

Further, as shown in FIG. 2B, the diode D1 may be connected in parallel to the matching capacitor C6. The diode D1 is connected in parallel to the matching capacitor C6 through a capacitor C10 and the cathode terminal of the diode D1 is grounded. One end of the matching capacitor C6 is grounded. One end of the bias resistor R1 is connected to a connection point of the capacitor C10 to the diode D1 and the other end of the resistor R1 is connected to the switching voltage input terminal Vsw.

Figure 3:
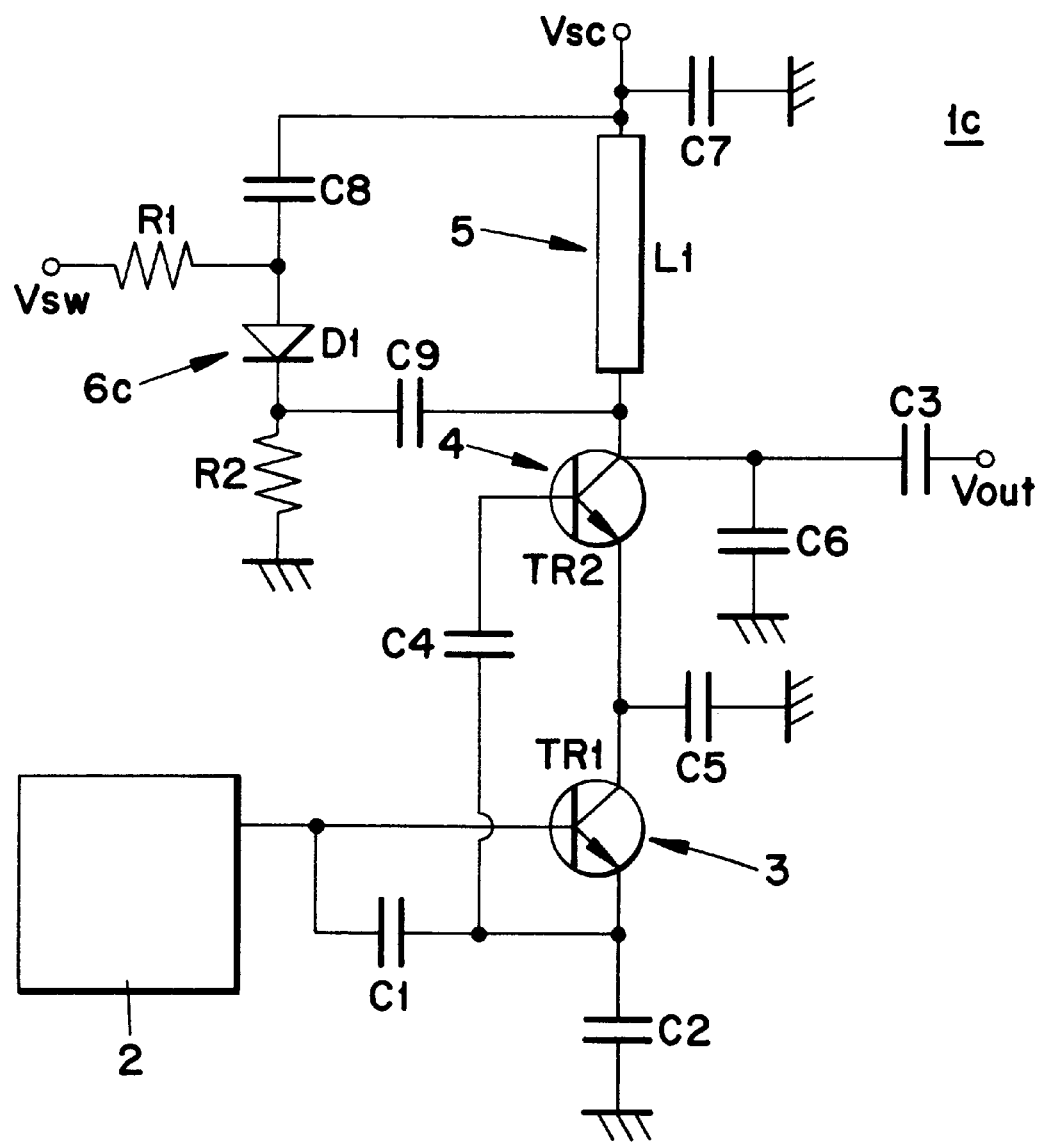
FIG. 3 is a block diagram illustrating the voltage control oscillator of the third exemplary embodiment of the present invention.

Next, the construction of the voltage control oscillator of the third embodiment of the present invention is described with reference to FIG. 3. In FIG. 3, the same sign is attached to the part same as or equivalent to that in FIG. 1, and its explanation is omitted.

In FIG. 3, 1c denotes a voltage control oscillator, which comprises the resonance circuit 2, the oscillation circuit 3, the buffer circuit 4, the matching circuit 5, and an impedance regulation circuit 6c. The impedance regulation circuit 6c is provided with the diode D1 as the switching element, the coupling capacitors C8,C9, and the bias resistors R1,R2. The diode D1 is connected in parallel to the matching inductor L1 to constitute the matching circuit 5. The coupling capacitor C8 is connected between one end of the inductor L1 and the anode terminal of the diode D1, and the coupling capacitor C9 is connected between the cathode terminal of the diode D1 and the other end of the inductor L1. The connection point of one end of the coupling capacitor C8 to the diode D1 is connected to the switching voltage input terminal Vsw through the bias resistor R1, and the cathode terminal of the diode D1 is grounded through the bias resistor R2.

Next, the operation of the voltage control oscillator 1c is described.

In a case where the oscillation frequency of the voltage control oscillator 1c is fa in the 800 MHz zone, the drive voltage for the diode D1 is applied, and the diode D1 is short-circuited in the high frequency manner. Thus, the inductor L1 of the matching circuit 5 is connected in parallel to the coupling capacitor C8. The synthesized impedance by the inductor L1, the coupling capacitor C8 and the matching capacitor C6 becomes larger than the synthesized impedance when no drive voltage is applied to the diode D1. The matching circuit 5 is set to be matched with the frequency fa by the synthesized impedance by the inductor L1 and the matching capacitor C6, and only the signal of the frequency fa is outputted.

On the other hand, in a case where the oscillation frequency of the voltage control oscillator 1c is fb in the 1.6 GHz zone, no drive voltage is applied to the diode D1. Thus, the diode D1 has small capacitance in the high frequency manner, and the capacitance of the diode D1 becomes dominant in the synthesized capacitance of the diode D1 and the capacitor C8 connected in series to the diode D1, and the synthesized capacitance becomes small. Because the synthesized capacitance of the capacitor C8 and the diode D1 is small, the inductance of the inductor L1 connected in parallel to the capacitor C8 and the diode D1 is little changed. The matching circuit 5 is set to be matched with the frequency fb by the synthesized impedance by the inductor L1 and the matching capacitor C6, and only the signal of the frequency fb is outputted.

Thus, in the voltage control oscillator 1c, the inductance of the inductor L1 is changed by turning on/turning off the diode D1 according to the frequency selected by the resonance circuit 2, and the synthesized impedance with the matching capacitor C6 is changed. Matching can be achieved with two frequencies respectively, and the desired output voltage can be obtained by lowering the higher order harmonic level.

In the first to third embodiments, the cases where the diode is used as the switching element are described, and a transistor or a variable capacitance diode may be used in place thereof.

Further, in the first to third embodiments, the voltage to drive the resonance circuit may also be used as the drive voltage to be applied to the diode.

In the voltage control oscillator of the present invention, the switching element to constitute the impedance regulation circuit is turned on/turned off according to the frequency selected by the resonance circuit. The inductance or the capacitance in the matching circuit is changed, and as a result, the synthesized impedance is changed to achieve the matching with two frequencies respectively. The desired output voltage can be obtained by lowering the higher order harmonic level through matching with the respective frequencies by switching two frequencies.

What is claimed is:

1. A voltage control oscillator comprising:

a resonance circuit which selects either of two frequencies different from each other, and outputs a signal resonated at the selected frequency;

an oscillation circuit which is provided with a first transistor, amplifies and oscillates the output signal of said resonance circuit;

a buffer circuit which is provided with a second transistor, and amplifies the output signal of said oscillation circuit;

a matching circuit which is provided with a first inductor and a matching capacitor, and matches the output signal of said buffer circuit; and an impedance regulation circuit provided with a switching element, wherein, the synthesized impedance in said matching circuit is changed so as to achieve the matching with the frequency selected by said resonance circuit by turning on/turning off said switching element of said impedance regulation circuit according to a voltage to be applied.

2. A voltage control oscillator according to claim 1, wherein, said matching circuit comprises said first inductor, a second inductor and said matching capacitor wherein said first inductor and said second inductor are connected in series to each other, and a connection point of the first inductor to the second inductor is connected to said switching element of said impedance regulation circuit.

3. A voltage control oscillator according to claim 1, wherein, said switching element of said impedance regulation circuit is connected in series or in parallel to the matching capacitor of said matching circuit.

4. A voltage control oscillator according to claim 1, wherein, said switching element of said impedance regulation circuit is connected in parallel to said fiat inductor of said matching circuit.

5. A voltage control oscillator according to one of claim 1,
   wherein, said switching element comprises either of a diode, a transistor or a variable capacitance diode.

6. A voltage control oscillator according to claim 2,
   wherein, said switching element comprises either of a diode, a transistor or a variable capacitance diode.

7. A voltage control oscillator according to claim 3,
   wherein, said switching element comprises either of a diode, a transistor or a variable capacitance diode.

8. A voltage control oscillator according to claim 4,
   wherein, said switching element comprises either of a diode, a transistor or a variable capacitance diode.

* * * * *